United States Patent [19]

Spalding

[11] Patent Number: 4,647,909
[45] Date of Patent: Mar. 3, 1987

[54] SIGNAL SAMPLING AND CONVERSION SYSTEM

[76] Inventor: David I. Spalding, 45A Blackett Drive, Castle Hill, N.S.W. 2154, Australia

[21] Appl. No.: 572,658

[22] Filed: Jan. 20, 1984

[51] Int. Cl.[4] ............................................. H03M 1/12
[52] U.S. Cl. ............................. 340/347 SH; 315/8.51
[58] Field of Search ........................ 365/118; 315/8.51; 340/347 P, 347 SH; 328/151; 307/352, 353; 357/31; 313/391

[56] References Cited

U.S. PATENT DOCUMENTS

| | | | |
|---|---|---|---|
| 2,496,633 | 2/1950 | Llewellyn | 315/8.51 |
| 2,528,187 | 10/1950 | Sziklai | 315/8.51 |
| 2,534,372 | 12/1950 | Ring | 315/8.51 |
| 2,632,058 | 3/1953 | Gray | 315/8.51 |
| 2,729,701 | 1/1956 | Levy | 340/347 P |
| 2,812,133 | 11/1957 | McMillan | 315/8.51 |
| 4,034,363 | 7/1977 | Etten | 315/8.51 |

FOREIGN PATENT DOCUMENTS 0036340 9/1981 European Pat. Off. ............ 315/8.51

Primary Examiner—Charles D. Miller
Attorney, Agent, or Firm—Darby & Darby

[57] ABSTRACT

A signal sampling and conversion system for high-frequency sampling of either recurrent or non-recurrent signals in which the electron beam (9) generated by an electron gun (1) of a CRT is scanned across a target semiconductor integrated-circuit (4) comprising a linear array of tapered detection and storage elements in two opposing groups represented by elements (5an) and (5bn), connected respectively to parallel-to-serial convertors (7a) and (7b). The sampling rate is proportional to the scan rate which is determined by the scan signal (11) applied to the deflection electrodes (3). The input signal (10) applied to a high-frequency deflection structure (2) causes charges to be accumulated in the elements of the array which are indicative of the amplitude or range of amplitudes of the input signal (10) during the period of each sample. The charges are removed from the array and converted to serial output data (14a) and (14b) which may then be processed to yield the amplitude of the input signal.

21 Claims, 9 Drawing Figures

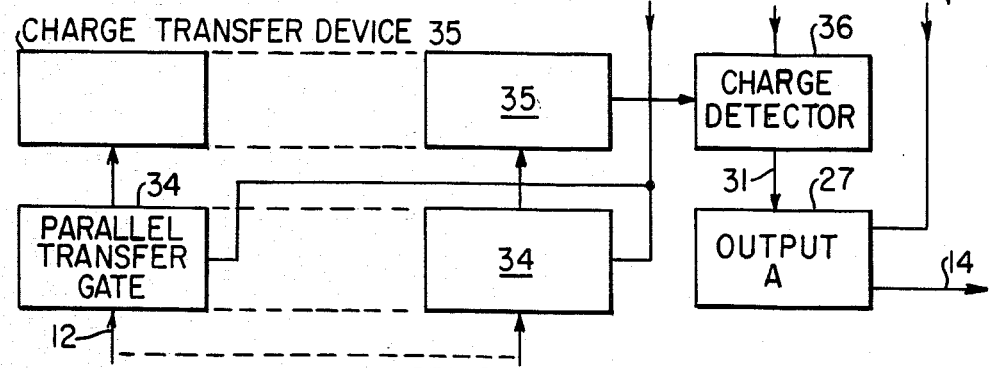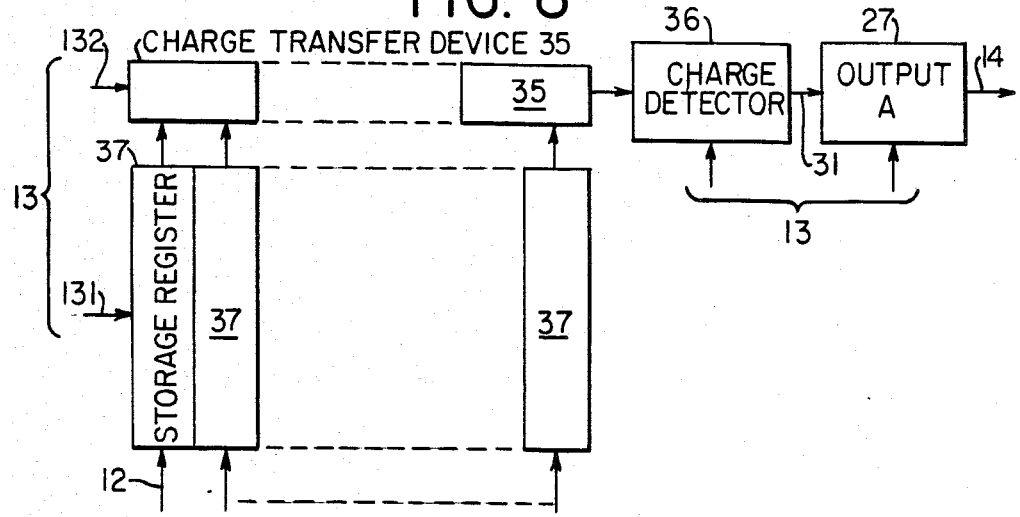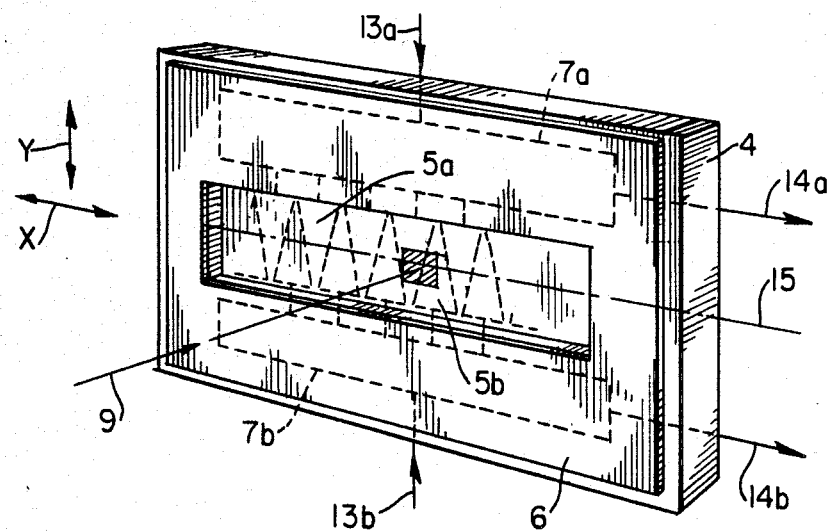

SIGNAL SAMPLING AND CONVERSION SYSTEM

This invention relates to a signal sampling and conversion system and in particular to a system which is suitable for the high-frequency sampling of either recurrent or non-recurrent signals, in applications where the subsequent processing of the acquired samples needs to be performed at relatively low frequencies as, for example, in analogue-to-digital conversion systems.

Techniques for the analysis or recording of a signal waveform commonly require that a plurality of time-referenced samples of the waveform be stored in the form of digitally-encoded words for subsequent processing. It is, however, known to be difficult to accurately encode, or quantize, samples at a high rate, particularly when high resolution is required simultaneously.

According to the well-known Nyquist-limit condition it is necessary, in a real time sampling system, for the sampling frequency to be at least twice that of the highest-frequency component of the signal being sampled. When, for very-high-frequency signals, this condition has been difficult to satisfy, it has been usual to employ the techniques of random or sequential sampling, in each of which a continuously-recurring signal is sampled at a frequency below that of the signal and a complete set of waveform samples is accumulated over a period containing many signal cycles. Neither of the latter techniques, however, is applicable to non-recurring signals.

In previously-known sample-and-hold systems, a sample of a signal is acquired by charging a storage capacitor, through a switch or other suitable circuit, for the duration of a sample period to a voltage which will be as nearly as possible equal in magnitude to the instantaneous voltage of the said signal at the end of the sample period. The capacitor current in the sample period is a function of the instantaneous difference between the signal and capacitor voltages. The sample period must therefore be long enough to allow the said difference in voltages to reach an acceptably low level before the capacitor is isolated from the charging circuit for the hold period. This sample-and-hold cycle may be repeated in response to timing pulses.

It will be apparent to those skilled in the art that if the signal to be sampled changes in magnitude during a sample period, the resulting sample may not be a true representation of the signal magnitude at the end of the sample period. In particular, the storage capacitor voltage will lag the signal voltage; irregularity in the timing of sample pulses combined with the sample-hold transition time will cause uncertainty of the signal voltage at the end of the sample period; random noise of higher frequency than the sample rate will cause random sample-voltage errors; and in general, neither the signal voltage at the end of the sample period nor the resulting sample voltage will be truly representative of the signal voltages ocurring prior to the end of the sample period.

Several techniques are known which employ methods of electron-beam scanning to achieve very high sampling rates. Typically, a large number of samples is acquired in a single scan and stored temporarily before being further processed at a relatively low rate. The techniques include:

(a) a scan convertor tube using a two-dimensional silicon-diode target storage array, with separate writing and reading electron beams;

(b) a scan-convertor tube using a phosphor-screen CRT, micro-channel plate beam intensifier and fibre-optically-coupled vidicon camera tube or two dimensional charge-coupled device (CCD) sensor array;

(c) a scan-convertor tube using a two-dimensional sapphire storage target and single write-read electron beam;

(d) a CRT with a linear-array electron-bombarded semiconductor (EBS) integrated-circuit target, employing intensity-modulation of the electron beam by the signal;

(e) a CRT with a two-dimensional-array EBS integrated-circuit target, employing deflection-modulation of the electron beam by the signal; and (f) a CRT with a linear-array EBS integrated-circuit target, employing small-amplitude deflection-modulation of a rectangular-cross-section electron-beam by the signal.

In the preceding electron-beam scanning methods (a), (b), (c) and (e) a charge or light pattern is generated in a target screen under the bombardment of a writing electron beam in a manner similar to a cathode-ray oscilloscope. Various means are employed to read out the temporarily-stored pattern. Improved writing speed and higher deflection sensitivity compared with a conventional oscilloscope tube result from the combination of the readout means and small target size. A disadvantage for many applications of methods employing a two-dimensional target is the need to process the resulting output signal to generate a unique amplitude value for the signal corresponding to each sample time or sub-division of the time-base scan. There is the further disadvantage that precise two-dimensional scan geometry is necessary for proper sample-timing at all signal amplitudes as well as amplitude accuracy.

The aforesaid disadvantages of two-dimensional methods may be overcome by using the intensity modulated electron-beam method (d) wherein elementary charges proportional to the instantaneous electron-beam current are generated in a plurality of semiconductor target elements disposed in a linear array. Some disadvantages of this technique are that the beam intensity-modulation characteristic is non-linear and that modulation at very high frequencies may be difficult to achieve because of the high signal voltage and power generally required.

The advantages of using a linear target array may be obtained without the disadvantages of beam intensity-modulation by using the deflection-modulation method (f). In this, the signal is applied to Y deflection plates as in systems with two-dimensional targets. However, the signal deflects a rectangular-cross-section electron-beam which scans in the X direction a linear array of one or two parallel rows of rectangular semiconductor elements. The element rows may be separated by an insensitive zone on which the beam impinges when zero signal is applied. Small Y deflections of the beam result in more or less exposure of each target element to the beam in each scan with resulting proportional charge generation and storage. At the end of a scan the charges corresponding to signal samples may be sequentially read out by suitable means at a conveniently low rate. Particular advantages which may be obtained with this method include: very high signal sensitivity; a high effective writing rate, which is independent of signal frequency and amplitude; simplified scan geometry; the ease of application of high-frequency signals to deflection electrodes which may be kept near ground potential; wide dynamic range; and the comparatively low cost of a linear-array semiconductor-target integrated circuit.

An inherent disadvantage of method (f) is the dependence of amplitude conversion linearity on the electron-beam shape since the cross-section of the electron beam may be dependent on X-deflection angle and further may be dependent on the selected X-deflection rate where operation over a range of deflection rates is required. Furthermore, the system is sensitive to low-frequency electron-beam amplitude fluctuations.

According to the present invention there is provided a signal sampling and conversion system comprising: an electron gun operable as a controlled-current source to generate an electron beam convergent upon a target; a time-base deflector means operable to scan the said electron beam across the said target in a direction parallel to a datum line; an input-signal deflector means operable to deflect the said electron beam orthogonally from the said datum line according to the instantaneous value of the said input signal; the said target further comprising a plurality of electron-beam detector elements distributed along the said datum line, the dimension parallel to the said datum line of the area exposed to the electron beam of any such detector element varying as a specified function of the perpendicular distance from the said datum line, resulting in the number of incident electrons received by the said detector element during an electron-beam scan being a similar specified function of the displacement of the said electron-beam orthogonally from the said datum line, the incident electrons generating in the said detector element a proportionate charge which is retained in storage means combined with or connected to the said detector element; and a convertor operable to remove the charges thus stored and from the amplitudes of the said charges generate output signals representing a sequence of samples of the said input signal or a derivative thereof.

Embodiments of the present invention will now be described with reference to the drawings in which, for clarity and ease of comprehension only, the proportions and dimensions of component parts have been disregarded and insignificant details generally omitted, and in which:

FIG. 3 is a block diagram of signal processor means which, in combination with the second embodiment, constitutes a third embodiment of the present invention which has reduced sensitivity to electron-beam current fluctuations;

FIG. 4 is diagram similar to FIG. 3 illustrating a variant signal processor means of the fourth embodiment, FIG. 5 is a block diagram illustrating a first alternative conversion means of the present invention, embodying an MOS-transistor multiplexer means;

FIG. 6 is a block diagram illustrating a second alternative conversion means similar to that of FIG. 5 but having a parallel buffer-amplifier scheme;

FIG. 7 is a block diagram illustrating a third alternative conversion means wherein charge transfer is effected through a CCD analogue shift register;

FIG. 8 is a block diagram illustrating the conversion means of a special embodiment of this invention in which the conversion means includes parallel charge transport and storage means, permitting the rapid acquisition of charge samples resulting from a plurality of sequential scans;

FIG. 9 is a perspective schematic diagram showing a variant embodiment of a signal sampling and conversion system, similar to the second embodiment shown in FIG. 2, in which the target detector elements are addressed by the electron-beam from the opposite face of the target integrated-circuit.

Figure 1:
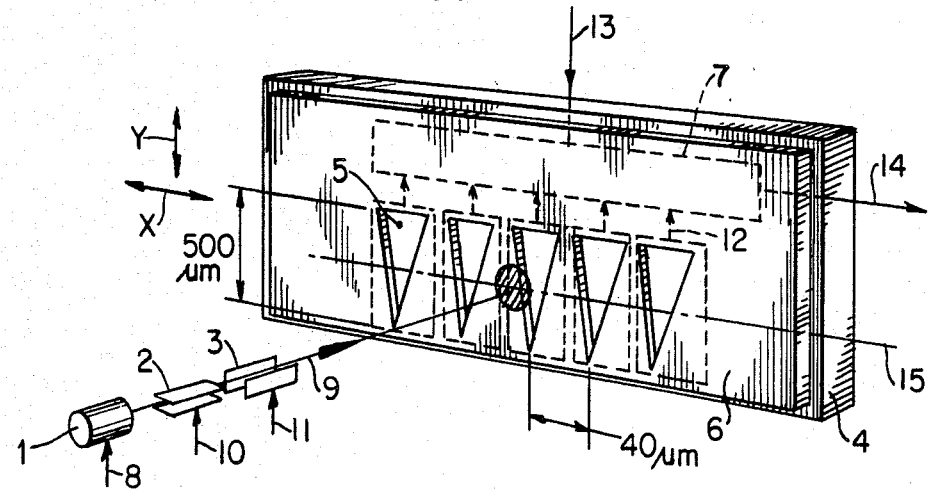
FIG. 1 is a perspective schematic diagram of a signal sampling and conversion system in accordance with the first embodiment of the present invention.

There is shown in FIG. 1 a signal sampling and conversion system comprising, within an evacuated enclosure which has not been shown:

an electron gun 1 which generates an electron beam 9 having a constant current amplitude which is in relation to a control input combination 8 and, for a set amplitude dynamic range of the system, is in proportion to a selected sample rate, the said electron beam being focussed on the surface of a semiconductor integrated-circuit target 4;

an X-axis deflection assembly 3 operable to deflect the electron beam 9 in proportion to a time-base input 11, a linear differential sawtooth signal for example, causing the said electron beam to scan the surface of the target 4 in a direction X parallel to a datum line 15;

a Y-axis deflection assembly 2 operable to deflect the electron beam 9 orthogonally from the datum line 15, the displacement in the Y direction from the said datum line being in proportion to the instantaneous value of a signal input 10;

an array of detector elements 5, each combined with storage means, uniformly disposed along and approximately centred upon the said datum line, the area of each element 5 exposed to the electron beam being approximately triangular in shape and defined by a conductive mask overlay 6 insulated from the underlying circuit by, for example, a layer of phosphorus-doped glass which is not shown;

and further comprising a conversion means 7 which, although shown integrated on the target substrate 4, may be partly external to the said target or to the evacuated enclosure and which is connected to the said detector elements and is operable in response to timing inputs 13 to remove charge samples 12 stored in the said detector elements and generate corresponding output information 14.

In principle the target detector-elements 5 may be composed of any suitable conductive material. In practice, however, it is desirable, up to a point, to maximise the efficiency with which the electron-beam energy is utilised to generate charge carriers in the target elements. For example, in a silicon diode detector, or in a detector site formed in a silicon CCD integrated circuit, each incident electron from a beam with an energy, for example, of 5 keV generates approximately 1400 charge carriers. This high conversion gain assists in the achievement of a very fast sample rate by minimizing the electron-beam current requirement. Although the said conversion gain is approximately proportional to beam energy, increasing the beam energy may lead to reduced life of the target integrated circuit. Furthermore there is a point at which increasing the gain reduces the amplitude resolution owing to the significant effect of individual beam electrons.

The mask 6 may be held at a potential more positive than the detector elements 5 in order to collect secondary electrons. In addition, or alternatively, supplementary electrodes with a positive bias, situated so as not to interfere with the primary electron beam, may be included for secondary electron collection near the target.

An example target comprises 256 silicon diode detector elements 5, arranged in a band having a Y-dimension of 500 μm and a detector-element pitch in the X direction of 40 μm. The effective dimension of the electron beam 9 in the X direction is preferably made less than or equal to the detector-element pitch for good time-resolution. The effective dimension in the Y direction is preferably just large enough to reduce the effect of anticipated manufacturing blemishes in the mask 6 to a desirable level and is, for example, about 25 μm.

Precise alignment of the electron-beam scan with the detector element array is accomplished automatically by a calibration circuit means, or manually, as follows:

X and Y position is adjusted by addition of appropriate d.c. correcting inputs to the time-base input 11 and signal input 10 respectively;

angular alignment is accomplished by injection of an appropriate direct current into a scan rotation coil, not shown, which may be either inside or outside the evacuated enclosure but inside any magnetic shielding that may be fitted around the said evacuated enclosure according to established CRT practice.

In order to facilitate alignment of the scan it has been found advantageous to incorporate at each end of the detector-element array a pair of rectangular detector elements, not shown, disposed symmetrically one each side of the datum line so as to enable a differential output to be generated corresponding to the displacement of the said scan from the said datum line and thereby provide a null detection method of alignment.

The number of high-energy electrons captured by a single detector element 5 in any electron-beam scan is proportional both to the beam current and the exposure time of the said detector element to the electron beam and, for a set beam current and set scan rate, is therefore proportional to the effective X dimension of the said detector element determined at the corresponding Y deflection of the electron beam from the datum line.

For a detector element shape which is described by a linear function, and in the case of virtually constant Y deflection amplitude during the transition of a detector-element by the electron beam, the transfer function of the system, considered in respect of each sample, will also be substantially linear and independent of the shape of the electron-beam cross-section.

In a case where the Y deflection amplitude changes significantly during the transition of a particular detector-element by the electron beam, the number of electrons captured by the said detector element may be affected by the electron-beam cross-section. In an application where this effect is significant, advantage may be gained from making the electron-beam cross-section as nearly as possible rectangular and having an X dimension about equal to the detector-element pitch, in order to better integrate the Y deflection amplitude variations.

A non-linear transfer function may be realised if desired, for example to compensate for a known non-linearity elsewhere in a system, by appropriately shaping the detector elements. In like manner, non-linearity of the X deflection, particularly that which is related to the CRT design, may be compensated by variation of the width and pitch of the detector elements as a function of the detector-element distance from the centre of the element array.

The operation of the system according to the first embodiment is as follows:

At the start of a scan the electron beam 9 is located in a rest position on an insensitive target zone near one end of the detector element array shown in FIG. 1. A sampling sequence is initiated either synchronously or asynchronously with respect to the input signal 10 by application of a single-cycle time-base sawtooth input 11 which causes the said electron-beam to scan the array of detector elements 5 once at a selected rate equal to the product of the desired sampling rate and the detector element pitch. At the end of the scan the time-base input 11 causes the said electron beam to return to the said rest position. During the return scan electrons are prevented from striking any detector elements by the action of a blanking pulse generated synchronously with the said return scan.

The blanking pulse action may be achieved in the electron gun 1 according to established CRT practice or preferably by addition of the said blanking pulse to the signal input 10, causing the electron beam 9 to be deflected onto an insensitive area of the target 4 which is covered by the mask 6. The latter method permits faster operation. Resulting charge samples generated in the detector element array represent, when taken in sequence, the amplitude variation with time of the input signal 10 during the sampling scan. The said charge samples may be retained in the storage capacitance of the detector elements without significant loss of accuracy for a short time which is sufficient to permit the said charge samples to be removed by the convertor 7 in response to digital timing signals 13. The said convertor furnishes output information corresponding to the said charge samples in serial manner or in a parallel combination of a plurality of serial output signals. The said output information is transmitted at a rate which is independent of the input signal sampling rate and which can be made appropriate to the response speed of an ensuing signal processor for example a high resolution analogue-to-digital conversion system, which may be required to receive the said output signals.

A disadvantage of the first embodiment is the inability of the system to discriminate against the effects of electron-beam current fluctuations of lower frequency than the selected sample rate, although long-term variations may generally be corrected by means of a calibration routine, particularly when implemented through the medium of a digital microprocessor system.

Figure 2:
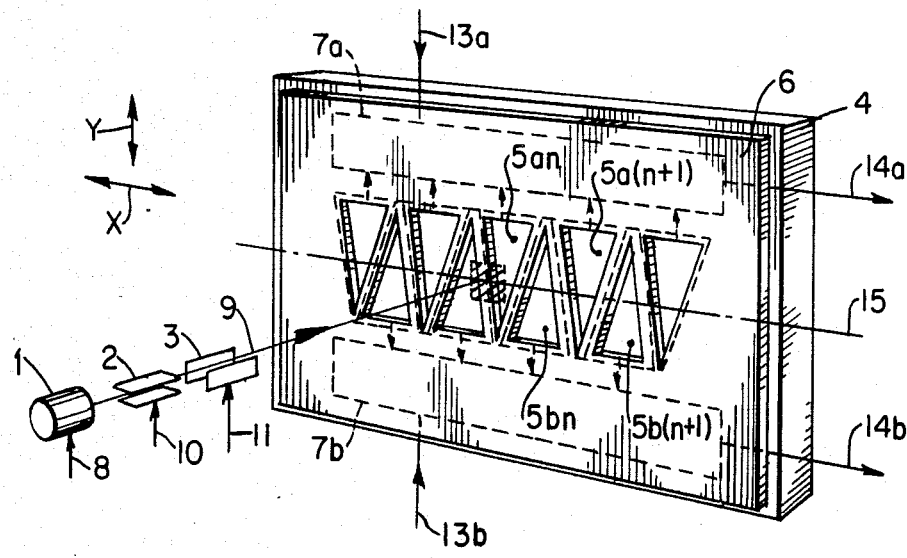
FIG. 2 is a diagram similar to FIG. 1 illustrating an arrangement of the second embodiment which makes possible improved performance.

A second embodiment of the invention, similar to the first, which provides a means for overcoming the aforesaid disadvantage of the first embodiment is illustrated in FIG. 2, in which:

an electron gun 1, Y deflector means 2 and X deflector means 3 are provided as in the first embodiment; integrated-circuit target 4 carries a linear array of interlocked and alternately-opposing detector elements 5a and 5b disposed along the datum line 15 in the focal plane of the electron beam 9; an approximately triangular area of each detector element is delineated by the conductive mask 6 which extends over the junction peripheries between the detector elements for protection against damage from electron bombardment, and which otherwise performs the functions earlier described; a convertor means 7a is operable to remove charge samples 12a from the detector elements 5a and furnish serial output information 14a in response to digital timing inputs 13a; a convertor means 7b is operable in like manner with respect to charge samples 12b, detector elements 5b and timing inputs 13b to furnish output information 14b.

In aninferior form of the second embodiment, the detector elements are arranged in pairs presenting to the electron beam opposing areas shaped approximately as right triangles, each pair yielding a single sample according to the difference in charge generated in each detector element of a pair, said difference being preferably related to the sum of the charges generated in the said pair.

In the preferred form of the second embodiment the exposed detector element areas are shaped approximately as isoceles triangles. The operation of this device is as follows:

The electron beam generation and deflection means are operable as in the first embodiment shown in FIG. 1. Charges are generated in the detector elements in the same manner as in the first embodiment, with the exception that the phase of input signal 10 giving rise to an increase in charge generated in a detector element is inverted for the detector elements 5b compared with the elements 5a. Output signals 14a and 14b are preferably furnished alternately so that the time order of the sampling sequence is preserved.

In the case when the input signal 10 is zero during a sampling scan the scan is coincident with the datum line 15, resulting in the generation of substantially equal charges in the detector elements 5a and 5b. This factor facilitates initial scan alignment.

In general for a set Y deflection and linear detector elements, the difference in the charge samples generated in any adjacent opposing pair of detector elements is proportional both to the Y deflection of the electron beam from the datum line and to the electron-beam current at a set sampling scan rate. It is apparent, however, that the sum of the charge samples in the said opposing pair is independent of the Y deflection but proportional to the electron-beam current. What is preferably required, therefore, is output data representing the ratio of the difference to the sum of the charge samples emanating from adjacent opposing pairs of detector elements, which may be readily obtained by transmitting output signals 14a and 14b through analogue-to-digital conversion means to digital microcomputor means.

Considering the target array illustrated in FIG. 2, the output signals 14a corresponding to any adjacent detector element pair 5an, 5a(n+1), are denoted by the terms san, sa(n+1) respectively and the output signals 14b corresponding to the opposing detector elements 5bn, 5b(n+1) by the terms sbn, sb(n+1) respectively. Then the computed output data sequence includes the following order of terms:

$$\frac{san - sbn}{san + sbn}, \frac{sa(n + 1) - sbn}{sa(n + 1) + sbn}, \frac{sa(n + 1) - sb(n + 1)}{sa(n + 1) + sb(n + 1)},$$

the order being valid for all possible values of n.

Figures 3, 4, 5, 6:
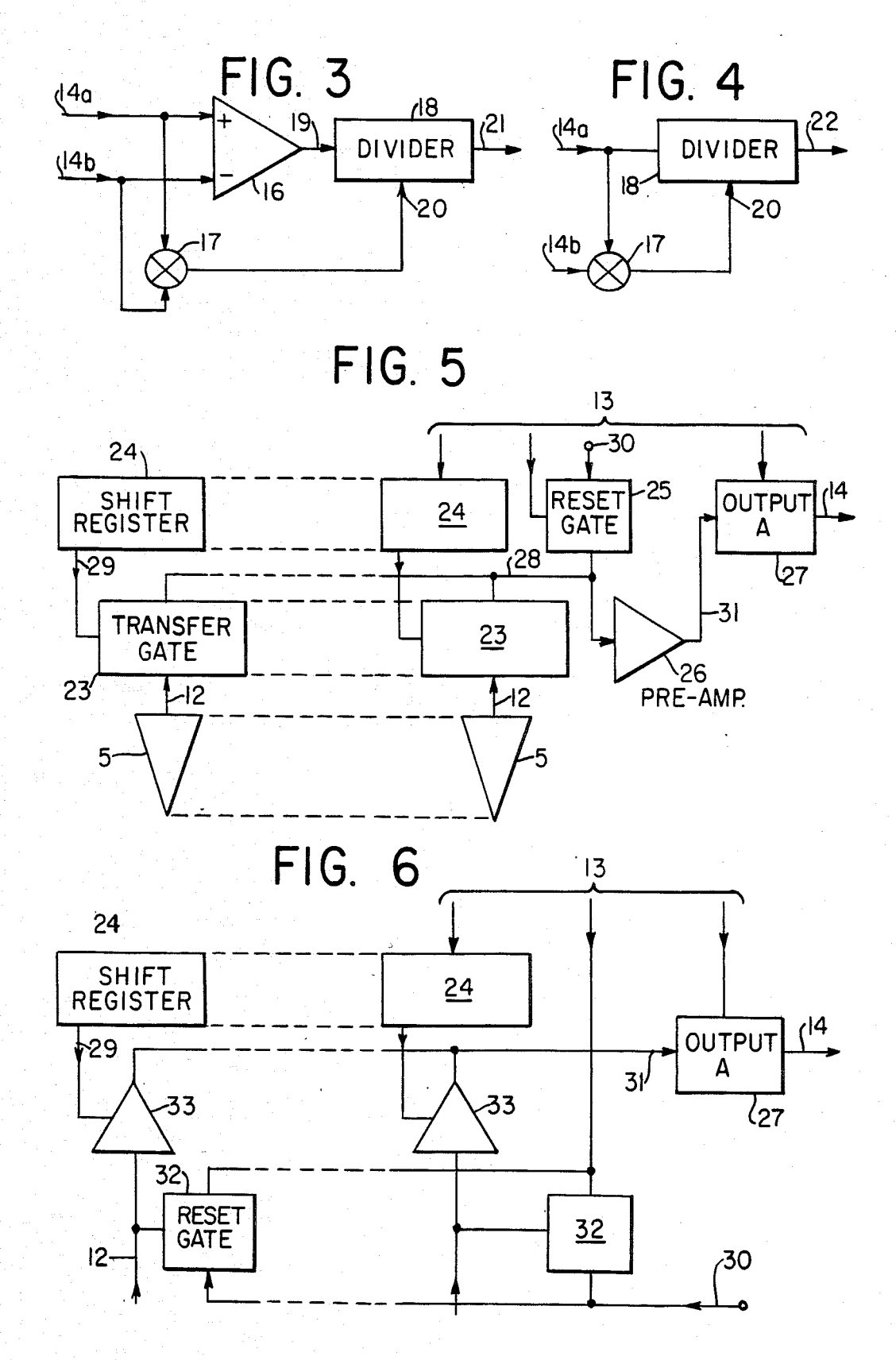

In a third embodiment the signal sampling and conversion system illustrated in FIG. 2 is combined with analogue computing means shown diagramatically in FIG. 3. The said analogue computing means is arranged to generate the ratiometric output data described in the preceding paragraph and comprises:

a differential amplifier 16 deriving from convertor signals 14a and 14b a difference signal 19; summing means 17 generating from convertor signals 14a and 14b a sum signal 20; and analogue divider means 18 furnishing output data 21 representing the quotient of dividend signal 19 and divisor signal 20.

In this embodiment it is necessary for the convertor means 7a and 7b to incorporate sample-and-hold means to provide temporary storage of the analogue signals 14a and 14b, thereby allowing alternating signals to be processed simultaneously.

The said sample-and-hold and computing means may be fabricated in integrated-circuit form and may, for example, be partially or wholly incorporated in the target integrated-circuit 4.

Advantages of this arrangement in some applications, compared with digital computation, are that improved speed is possible; the complexity is less; and quantizing errors are eliminated. Even where quantizing of the output 21 must be performed subsequently there may be improved speed and a reduction in rounding-off errors. A disadvantage where quantizing is to be performed is that the output 21 is bipolar which may be inconvenient in some applications of the system.

In a fourth embodiment of the present invention, an analogue computing means illustrated in FIG. 4 is combined with the signal sampling and conversion system illustrated in FIG. 2; the said analogue computing means comprising only a summing means 17 and divider means 18, the function of which is to provide a unipolar ratiometric output from the system.

In this embodiment the output 22 represents the quotient of the dividend signal 14a and the divisor signal 20, the latter being the sum of the convertor output signals 14a and 14b.

The computed output data sequence includes the following order of terms, as defined previously with reference to FIG. 2:

$$\frac{san}{san + sbn}, \frac{sa(n + 1)}{sa(n + 1) + sbn}, \frac{sa(n + 1)}{sa(n + 1) + sb(n + 1)},$$

the order being valid for all possible values of n.

The divider means 18 may comprise either an analogue divider circuit providing an analogue output 22 or a ratiometric quantizing circuit providing a digital output 22, according to the application.

The conversion means 7, 7a or 7b of the present invention has not been described in detail since the function of the conversion means may be implemented efficiently according to various alternative methods, for example methods familiar to those skilled in the art of solid-state imaging. Several conversion methods commonly used for optical detector systems are also suitable for use with electron detector systems.

For example only, three alternative conversion means are illustrated diagrammatically in FIGS. 5, 6 and 7. The operation of each is well-known and will not be described here.

In FIG. 5 is shown a conversion means operable in response to timing inputs 13 and comprising: a digital shift register 24 generating sequential timing pulses 29; a plurality of transfer gates 23 transferring charge samples 12 to common line 28 in response to timing pulses 29; pre-amplifier 26 generating high level signals 31 from charge samples present on the common line 28; reset gate 25 operable to connect the common line 28 to a bias voltage supply 30 at the end of each sample conversion; and an output amplifier system 27, incorporating reference level clamping means, noise rejection means and sample-and-hold means, generating output signals 14 from high level signals 31.

In FIG. 6 is shown a conversion means similar to that shown in FIG. 5 but in which: the charge samples 12 are individually amplified in a plurality of gated amplifiers 33 which provide the functions of the transfer gates 23 and preamplifier 26 in the preceding example; and a plurality of reset gates 32 performs a function similar to that of the reset gate 25 in the preceding example.

In FIG. 7 is shown a conversion means comprising: an analogue shift register or charge transfer device 35, for example a CCD, operable to receive charge samples 12 simultaneously via a plurality of parallel transfer gates 34 and to transfer the said charge samples sequentially to charge detector means 36; and an output amplifier system 27 generating output signals 14 from the signals 31 generated by the said charge detector means.

It will be apparent to those skilled in the art that a disadvantage for some special applications of the conversion means hitherto described is that sets of charge samples resulting from successive sampling scans may not be processed in very rapid succession owing to the time necessary for the convertor means to sequentially transmit a set of charge samples.

FIG. 8 illustrates both the storage and conversion means of a special embodiment of the present invention which enables charge samples resulting from a plurality of successive sampling scans to be stored simultaneously prior to conversion to serial output information and which comprises: a plurality of storage register means 37, equal in number to the number of detector elements constituting the target element array, each said storage register means being connected to a corresponding detector element and operable to receive and store a sequence of analogue charge samples 12 from the said detector element and to re-transmit a delayed sequence of charge samples 12d which is representative of the sequence of charge samples 12; output register means 35 operable to receive parallel sets of delayed charge samples 12d and transport said delayed charge samples sequentially to charge detector means 36; and an output amplifier system 27 generating output signals 14 from the signals 31 generated by the said charge detector means.

The operation of the device is as follows:

At the end of a sampling scan the charges 12 are transferred in parallel through register input gates to the first stage of each storage register 37 in response to a timing signal 131; at the same time charge samples which may be already present in the storage registers are advanced one stage. The cycle is repeated until the storage registers are filled with charge samples.

Further timing signals 131, typically at a lower repetition rate than for sample acquisition, then cause sets of the delayed charge samples 12d to be transmitted in parallel to the output register 35 which is operable in response to timing signals 132 as an analogue parallel-to-serial convertor. The output signal 14 is generated in the same manner as in the system illustrated in FIG. 7. The registers 35 and 37 are preferably of the CCD type, although whether they are of single-phase, two-phase or three-phase structure does not matter, and may be fabricated on the target integrated-circuit. However, in other non-illustrated variants of this embodiment, different types of register, for example MOS-transistor, may be used.

Any number of sampling scans, for example 128, may be accommodated, according to the number of stages, or storage elements, in each register 37. Furthermore, the registers 37 may be divided into a plurality of groups, each of the said groups having a separate output register means, charge detector means and output amplifier system.

There is shown in FIG. 9 a variant embodiment of a target integrated circuit means of the present invention which provides an alternative means of protection against damaging effects of high-energy electrons and which comprises: a semiconductor integrated-circuit 4 having on a first surface, being that surface which is obscured from the electron-beam 9, an array of target detector-elements 5a and 5b as previously described and at least part of convertor means 7a and 7b as previously described, and having in the region occupied by the said detector elements a substrate thickness which is uniform and very much reduced; a conductive mask 6 deposited on a second surface parallel to said first surface, being that surface of the integrated circuit 4 which faces the electron-beam 9, and having an aperture through which is exposed only that region of the said substrate which is occupied on the said first surface by the said detector elements.

The operation of the device is similar to that of the second embodiment illustrated in FIG. 2 except for the following:

the high-energy electrons from the beam 9 impinge on the thin substrate material in the region of the detector elements 5a and 5b instead of the surface of the said detector elements;

the thickness of the substrate in the region of the detector elements is chosen with regard to the energy of the incident electron beam;

protective masking is not required between adjacent detector elements, the boundaries of the detector elements being delineated instead by sharply-defined doped regions produced by diffusion.

The scheme illustrated in FIG. 9 is applicable to any of the preceding embodiments and may be particularly advantageous where CCD elements are employed in the detector-element array and the conversion means.

The foregoing is a description of only a few preferred embodiments of the present invention. For example, the number, size and pitch of target detection and storage elements may be varied, in conjunction with corresponding changes to the conversion elements, to satisfy different time and amplitude resolution requirements.

In other non-illustrated embodiments, the shape of the target detection and storage elements may be varied to realise different transfer functions; the conversion means may incorporate various signal processing and storage functions, for example parallel processor means which enable high operating speed or complex processing functions to be realised; the deflection means may be of meander-line or helical form to achieve wide signal bandwith; the electron-optics may include magnetic elements; the electron-beam cross-section may be varied; the semiconductor target material and method of manufacture may be varied; the materials, form and method of manufacture of the CRT envelope, electron gun and deflection means may be varied, for example to achieve great ruggedness and precision as is desirable for the attainment of a very fine amplitude resolution; and the electron gun may include electrodes for reducing the shot noise in the electron beam.

I have found the advantages of the illustrated embodiments of this invention to be that each is able to acquire and store a plurality of samples of a signal during a selected time interval; to convert said stored samples to one or more serial outputs having an analogue data rate suitable for quantization or other processing of the data; to achieve the sampling and conversion of very-high-frequency signals by a compact, economical, reliable and accurate means; to reduce sampling errors caused by unwanted noise or frequency components higher than the sampling rate; to reduce relative timing errors of samples; to virtually eliminate sampling errors caused by rapid transitions of the signal; to provide in a first alternative system a transfer function which is substantially independent of electron-beam cross-section; to provide in a second alternative system a transfer function which is substantially independent of both the electron-beam cross-section and low-frequency electron-beam current fluctuations; to provide in a third alternative system the advantages of the said second alternative system in conjunction with a capacity to store simultaneously the samples from a sequence of scans prior to conversion to serial output data, thereby enabling the delay between successive scans to be reduced by, for example, a factor of 500.

The claims defining the invention are as follows; I claim:

1. A signal sampling and conversion system comprising:
   an electron gun operable as a controlled current source to generate an electron beam convergent upon a target;
   time-base deflector means operable to scan said electron beam across said target in a direction parallel to a predetermined datum line;
   input-signal deflector means operable to deflect said electron beam in a deflection direction orthogonally from said datum line according to the instantaneous value of said input signal;
   said target comprising a plurality of electron-beam detector elements distributed along said datum line, each detector element having a sensing area exposed to the electron beam, the width of which is defined parallel to said datum line and the height of which is defined in said deflection direction, said sensing area being shaped so that its width at any height is a predetermined function of said height, the number of incident electrons received by said detector element during an electron-beam scan being a similar predetermined function of the displacement of the said electron-beam orthogonally from said datum line, the incident electrons generating in each detector element a proportionate charge;
   means coupled with said detector element for storing said charge; and
   convertor means for removing the charges thus stored and from the amplitudes of the said charges generating output signals representing a sequence of samples of said input signal or of a derivative of said input signal.

2. A system as claimed in claim 1 wherein the convertor is of the type which removes the charges and generates output data representing the amplitude of each of said charges in a sequential manner, said output data being generated from one or more charges simultaneously and furnished to one or more output lines.

3. A system as claimed in claim 1 wherein the target includes a linear array of interlocked and alternately-opposing detector elements disposed along said datum line and arranged so that the difference in the charges stored in each adjacent element of an opposing detector-element pair is representative of the value of the input signal during a sampling period of said detector-element pair for a constant electron-beam current.

4. A system as claimed in claim 3 wherien the the convertor includes computing means operable to furnish a bipolar ratiometric output proportional to the difference in charges generated in a first and second detector element of an opposing pair of detector elements and inversely proportional to the sum of the charges generated in said first and the second detector elements of said opposing pair.

5. A system as claimed in claim 1 wherein the storage means comprises a storage register operable to remove and store the charge generated in said detector element during each of a consecutive series of scans and, on completion of said series of scans, to transmit the stored charges sequentially to the converter means, the series of charges relating to any scan being furnished to the convertor similtaneously to a plurality of like storage registers.

6. A system as claimed in claim 5 or 3 wherein the convertor includes computing means for furnishing a unipolar ratiometric output proportional to the charge generated in a first detector element of an opposing pair of detector elements and inversely proportional to the sum of the charges generated in said first and the second detector elements of said opposing pair.

7. A system as claimed in claim 6 wherein said computing means includes divider means which is a ratiometric analogue-to-digital convertor circuit.

8. A system as claimed in claim 1 wherein the target comprises a semiconductor integrated circuit which includes the detector elements, storage means and at least one CCD charge transfer circuit.

9. A system as claimed in claim 8 wherein the detector elements are combined with storage means and comprise CCD elements.

10. A system as claimed in claim 9 further comprising:
   a first surface of a target integrated-circuit being that surface which is obscured from the electron beam, said detector element array being borne thereon, the integrated circuit substrate being of substantially reduced but uniform thickness in the region of said detector-element array;
   a conductive mask carried on a second surface parallel to said first surface and facing the electron beam and having an aperture through which is exposed to the electron beam that region of the said substrate which is occupied on said first surface by said detector-element array; and
   means for connecting said conductive mask to a suitable bias-voltage supply.

11. A system as claimed in claim 9 wherein the boundary of the exposed area of each detector element is defined by a conductive mask which shields the edges of each diode junction from electron-beam bombardment and which may further shield such other circuit elements of the target integrated-circuit as may be required, said mask being deposited over a layer of insulating material and, in operation, connected to a suitable bias-voltage supply.

12. A system as claimed in claim 1 wherein the target comprises a semiconductor integrated circuit which includes the detector elements, storage means and at least one MOS-transistor multiplexer driven by at least one of a digital shift register and counter means.

13. A system as claimed in one of claims 8 or 12 wherein the detector elements are combined with storage means and comprise integrated-circuit semiconductor diodes.

14. A system as claimed in claim 13 wherein the boundary of the exposed area of each detector element is defined by a conductive mask which shields the edges of each diode junction from electron-beam bombardment and which may further shield such other circuit elements of the target integrated-circuit as may be required, said mask being deposited over a layer of insulating material and, in operation, connected to a suitable bias-voltage supply.

15. A system as claimed in claim 13 further comprising:
a first surface of a target integrated-circuit being that surface which is obscured from the electron beam, said detector element array being borne thereon, the integrated circuit substrate being of substnatially reduced but uniform thickness in the region of said detector-element array;
a conductive mask carried on a second surface parallel to said first surface and facing the electron beam and having an aperture through which is exposed to the electron beam that region of the said substrate which is occupied on said first surface by said detector-element array; and
means for connecting said conductive mask to a suitable bias-voltage supply.

16. A system as claimed in claim 1 wherein each of the detector elements has an area exposed to the electron beam which is approximately triangular and has a dimension parallel to the datum line varying as a linear function of the perpendicular distance from said datum line.

17. A system as claimed in claim 1 wherein the detector elements are of uniform size in a direction parallel to the datum line and are distributed along the said datum line with uniform pitch.

18. A system as claimed in claim 1 wherein the electron-beam is of substantially-rectangular cross-section, having a dimension considered in the X direction which is about equal to the pitch of the detector elements, or of detector-element pairs in the case of alternately-opposing, interlocked detector elements; and having a dimension considered in the Y direction which is small compared with the dimension considered in the Y direction of the detector elements.

19. A system as claimed in claim 1 wherein the electron-gun is equipped with a system of control electrodes adapted for the purpose of removing noise energy of the type known as shot noise from the electron beam.

20. A system as claimed in claim 1 wherein each of the detector elements has an area exposed to the electron beam which is approximately triangular and has a dimension parallel to the datum line varying as a non-linear of the perpendicular distance from the said datum line as such function is required to compensate for known non-linearity in the system.

21. A system as claimed in claim 1 wherein size and pitch of the detector elements in a direction parallel to the datum line are varied as a function of the detector-element distance from the center of the element array to compensate for known X-deflection non-linearity.

* * * * *